(12) United States Patent
Koyama

(10) Patent No.: US 7,381,940 B2
(45) Date of Patent: Jun. 3, 2008

(54) LIGHT RECEIVING ELEMENT FOR POSITION DETECTION HAVING A PLURALITY OF RESISTANCE UNITS AND SENSOR AND ELECTRONIC APPARATUS HAVING THE SAME

(75) Inventor: Junichiro Koyama, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 92 days.

(21) Appl. No.: 11/510,705

(22) Filed: Aug. 28, 2006

(65) Prior Publication Data
US 2007/0057161 A1   Mar. 15, 2007

(30) Foreign Application Priority Data
Sep. 9, 2005   (JP)   ............................. 2005-261965

(51) Int. Cl.
*H01J 40/14*   (2006.01)
(52) U.S. Cl. .................................. 250/214 R; 250/221
(58) Field of Classification Search ............ 250/214 R, 250/221, 208.1, 214.1, 559.29, 559.3; 257/290–294, 257/440; 348/302, 308
See application file for complete search history.

(56) References Cited
U.S. PATENT DOCUMENTS
4,750,027 A * 6/1988 Asami ..................... 257/202

FOREIGN PATENT DOCUMENTS
JP   59-056774 A   4/1984
JP   61-108930 A   5/1986

* cited by examiner

Primary Examiner—Que T Le
(74) Attorney, Agent, or Firm—Birch, Stewart, Kolasch & Birch, LLP

(57) ABSTRACT

A light receiving element includes a plurality of light receiving cells arranged in matrix each of which converts an incident light into an electric signal and has an anode electrode and a cathode electrode whose polarities are different from each other, first to fourth output terminals, first to fourth resistance units including a plurality of resistors each having one end connected to the anode electrodes of the light receiving cells corresponding to the first column, the last column, the first row and the last row in a matrix of the light receiving cells and the other end connected to the first to fourth output terminals, and a fifth resistance unit including a plurality of resistors which connect the anode electrodes of adjacent light receiving cells with each other, in which the cathode electrodes of the respective light receiving cells are connected to a common potential in the matrix.

14 Claims, 3 Drawing Sheets

LIGHT RECEIVING ELEMENT FOR POSITION DETECTION HAVING A PLURALITY OF RESISTANCE UNITS AND SENSOR AND ELECTRONIC APPARATUS HAVING THE SAME

This nonprovisional application is based on Japanese Patent Application No. 2005-261965 filed with the Japan Patent Office on Sep. 9, 2005, the entire contents of which are hereby incorporated by reference. are hereby incorporated by reference.

BACKGROUND OF THE INVENTION

1. Field of the Invention

The present invention relates to a light receiving element and, more particularly, a light receiving element for position detection, and a sensor and an electronic apparatus having the same.

2. Description of the Background Art

Light receiving elements for position detection are used for a sensor or the like which detects a position of an object to be measured that reflects a light or the like based on a position of incidence of the light or the like in a light receiving element.

For example, Japanese Patent Laying-Open No. 59-056774 (Patent Literature 1) discloses a position detection device having such a light receiving element as described in the following. More specifically, in a position detection device in which on one of the surfaces of a semiconductor substrate of a certain conductivity type, a resistance layer of an opposite conductivity type is provided, and a converted current generated by corpuscular rays or the like which enter the resistance layer is divided by the resistance layer and extracted from a plurality of electrodes to detect a position of incidence of the corpuscular rays or the like, the resistance layer is surrounded by four resistance lines formed of a circular arc so as to have a connection point of the resistance line located at each angle of a square or a rectangle, an arithmetical circuit is provided which extracts a current from the connection point of the resistance line and operates the extracted current to obtain an output related to the position of incidence of the corpuscular rays or the like, and a predetermined relationship is given between a sheet resistivity of the resistance layer and the resistance line formed of a circular arc.

In addition, Japanese Patent Laying-Open No. 61-108930 (Patent Literature 2) discloses a position detection device having such a light receiving element as described in the following. More specifically, in a position detection device in which on a semiconductor substrate having a first conductivity type, a resistance layer of a second conductivity type is formed and a current generated by corpuscular rays or the like which enter the semiconductor substrate is divisionally output from a plurality of electrodes provided on the periphery of the resistance layer, the corpuscular rays or the like are made to enter from the side of the semiconductor substrate opposite to the surface on which the resistance layer of the second conductivity type is formed, a layer of the first conductivity type whose thickness is small enough and whose concentration is high is formed on the surface of the semiconductor substrate which corresponds to the surface of incidence, the resistance layer is configured to be surrounded by four resistance lines formed of a circular arc so as to have a connection point of the resistance line located at each angle of a square or a rectangle such that a current is extracted from the connection point of the resistance line, and a predetermined relationship is given between a sheet resistivity of the resistance layer and the resistance line formed of a circular arc.

In the position detection devices having a light receiving element recited in Patent Literature 1 and Patent Literature 2, however, in order to increase an S/N (Signal to Noise) ratio of a position signal indicative of a position of incidence of a light or the like in the light receiving element, that is, to increase an output current difference derived from a difference in a position of incidence of the light, a resistance layer whose sheet resistivity is extremely high should be formed. This is because when the sheet resistivity is low, variation in a sheet resistivity in each region of the resistance layer largely affects an output current to make accurate position detection difficult. Furthermore, in order to increase the S/N ratio of the position signal, a resistance layer whose sheet resistivity is highly uniform in the whole region of the semiconductor substrate should be formed.

Forming a resistance layer whose sheet resistivity is extremely high and making the sheet resistivity be uniform in the whole region of the semiconductor substrate is difficult in terms of a manufacturing process. In addition, although for increasing the sheet resistivity, an impurity concentration of the resistance layer should be decreased, decreasing the impurity concentration of the resistance layer will result in becoming liable to be affected by surface charges generated during the manufacturing process and surface charges generated according to environments of use. As a result, the sheet resistivity varies to cause characteristic variation, that is, variation in a sheet resistivity due to temperature and mobile ions or the like. The position detection devices having a light receiving element recited in Patent Literature 1 and Patent Literature 2 therefore have a drawback of difficulty in increasing an S/N ratio of a position signal in terms of a manufacturing process.

SUMMARY OF THE INVENTION

An object of the present invention is to provide a light receiving element enabling an S/N ratio of a position signal to be increased and a manufacturing process to be simplified, and a sensor and an electronic apparatus having such a light receiving element.

A light receiving element according to one aspect of the present invention includes a plurality of light receiving cells arranged in matrix each of which converts an incident light into an electric signal and has first and second electrodes whose polarities are different from each other, first to fourth output terminals, a first resistance unit including a plurality of resistors each having one end connected to the first electrode of the light receiving cell corresponding to the first column in the matrix of the light receiving cells and the other end connected to the first output terminal, a second resistance unit including a plurality of resistors each having one end connected to the first electrode of the light receiving cell corresponding to the last column in the matrix of the light receiving cells and the other end connected to the second output terminal, a third resistance unit including a plurality of resistors each having one end connected to the first electrode of the light receiving cell corresponding to the first row in the matrix of the light receiving cells and the other end connected to the third output terminal, a fourth resistance unit including a plurality of resistors each having one end connected to the first electrode of the light receiving cell corresponding to the last row in the matrix of the light receiving cells and the other end connected to the fourth output terminal, and a fifth resistance unit including a plurality of resistors which connect the first electrodes of the light receiving cells adjacent to each other in the matrix of the light receiving cells, in which the second electrodes of the plurality of light receiving cells arranged in matrix are connected to a common potential.

Preferably, the plurality of light receiving cells arranged in matrix have light receiving surfaces whose areas are substantially the same.

Preferably, at least one of the plurality of light receiving cells arranged in matrix has a light receiving surface whose area is different from those of other light receiving cells.

Preferably, the areas of the light receiving surfaces of the light receiving cells are gradually increased or decreased in the direction from the first row to the last row in the matrix of the light receiving cells or toward the direction from the first column to the last column.

Preferably, each resistor has substantially the same resistance value.

Preferably, a resistor connected to the first electrode of at least one light receiving cell among the plurality of light receiving cells arranged in matrix has a resistance value different from those of other resistors.

Preferably, the resistance values of the resistors are gradually increased or decreased in the direction from the first row to the last row in the matrix of the light receiving cells or in the direction from the first column to the last column.

Preferably, by divisionally forming a semiconductor layer of a second conductivity type on the side of a light receiving surface of a semiconductor layer of a first conductivity type, the plurality of light receiving cells arranged in matrix are formed.

More preferably, a resistivity of the semiconductor layer of the first conductivity type is not less than 200 Ωcm and less than 8000 Ωcm.

More preferably, an electrical insulting layer is formed on the light receiving surface of the semiconductor layer of the first conductivity type, and in a region on the electrical insulting layer corresponding to an interval between adjacent light receiving cells, each resistor is formed.

More preferably, each resistor formed in the region between the adjacent light receiving cells is made of polysilicon.

More preferably, an electrical insulting layer is formed on the light receiving surface of the semiconductor layer of the first conductivity type, and in a region on the electrical insulting layer corresponding to an interval between adjacent light receiving cells, an interconnection is formed.

A sensor according to one aspect of the present invention includes the light receiving element according to one aspect of the present invention.

An electronic apparatus according to one aspect of the present invention includes the sensor according to one aspect of the present invention.

According to the present invention, improvement of an S/N ratio of a position signal and simplification of a manufacturing process can be realized.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In the following, an embodiment of the present invention will be described with reference to the drawings.

Figure 1:
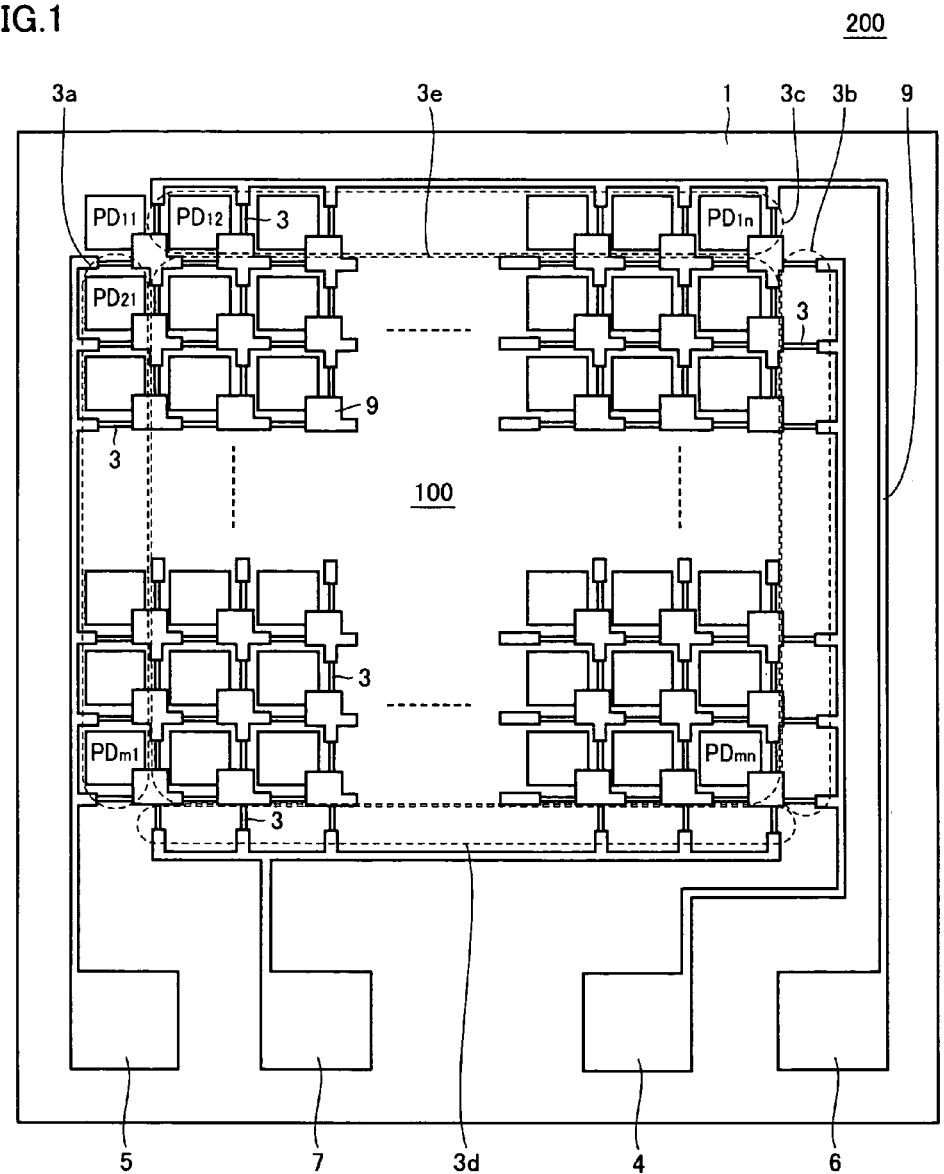
FIG. 1 is a plan view showing a structure of a light receiving element according to an embodiment of the present invention seen from the side of a light receiving surface.
Figure 2:
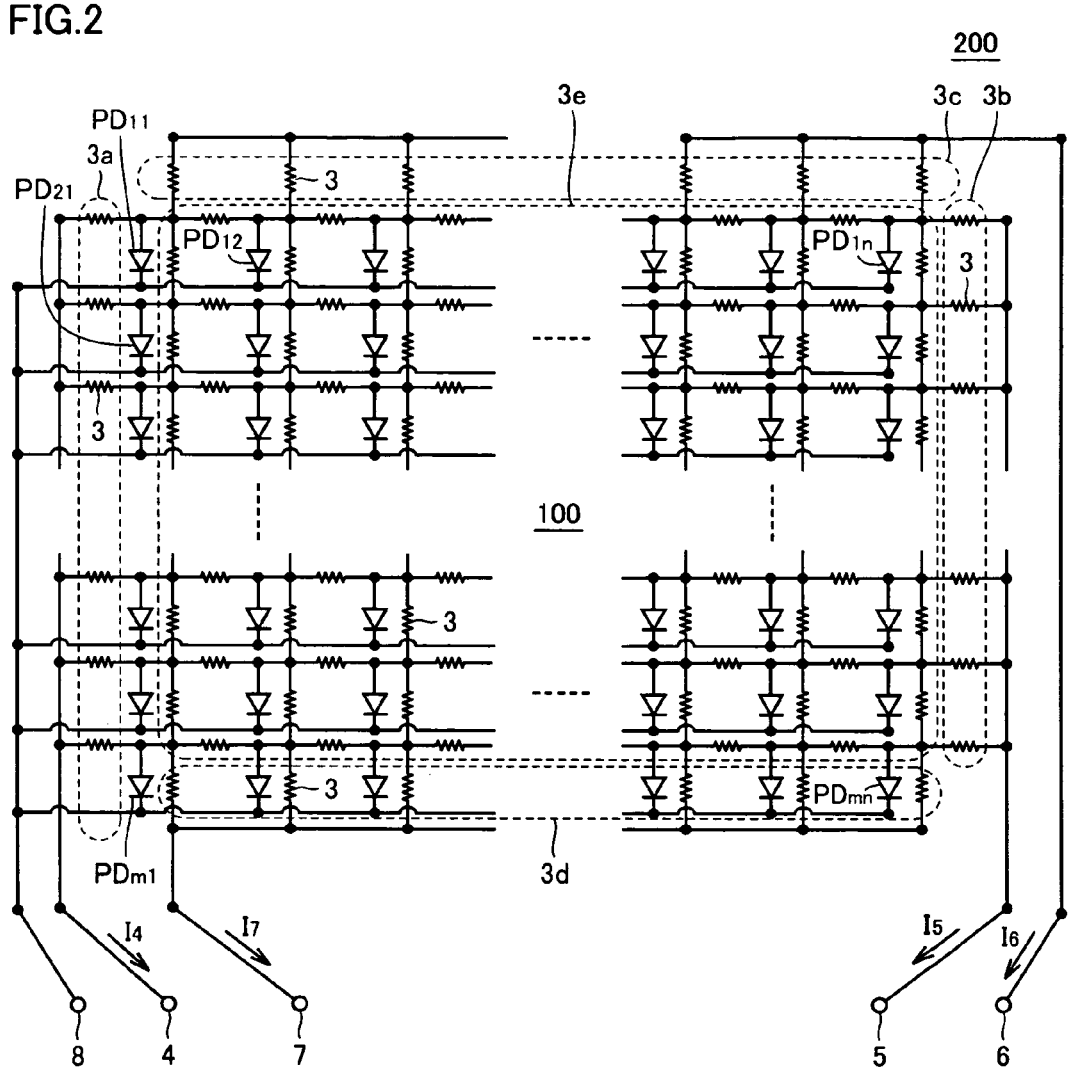
FIG. 2 is an equivalent circuit diagram of the light receiving element according to the embodiment of the present invention.

FIG. 1 is a plan view showing a structure of a light receiving element according to the embodiment of the present invention seen from the side of a light receiving surface. FIG. 2 is an equivalent circuit diagram of the light receiving element according to the embodiment of the present invention.

With reference to FIG. 1 and FIG. 2, a light receiving element 200 includes a number m×n (m and n are natural numbers not less than 2) of light receiving cells PD, output terminals (first to fourth output terminals) 4 to 7, resistance units (first to fifth resistance units) 3a to 3e and a cathode electrode 8.

Light receiving cell PD has two electrodes whose polarities are different, that is, an anode (electrode) and a cathode (electrode), and converts an incident light into an electric signal. The number m×n of light receiving cells PD are arranged in matrix to form a matrix 100 of m rows×n columns. In the following description, a row direction of matrix 100 will be referred to as an X axis direction and a column direction will be referred to as a Y axis direction.

Resistance unit 3a includes a plurality of resistors each having one end connected to anodes of light receiving cells PD11 to PDm1 corresponding to the first column of matrix 100 and the other end connected to output terminal 4.

Resistance unit 3b includes a plurality of resistors each having one end connected to anodes of light receiving cells PD1n to PDmn corresponding to the n-th column of matrix 100 and the other end connected to output terminal 5.

Resistance unit 3c includes a plurality of resistors each having one end connected to anodes of light receiving cells PD11 to PD1n corresponding to the first row of matrix 100 and the other end connected to output terminal 6.

Resistance unit 3d includes a plurality of resistors each having one end connected to anodes of light receiving cells PDm1 to PDmn corresponding to the m-th row of matrix 100 and the other end connected to output terminal 7.

Resistance unit 3e includes a plurality of resistors which electrically connect the anodes of light receiving cells PD adjacent to each other in matrix 100.

In the following, the resistors included in resistance units 3a to 3e will be referred to also as a resistor 3.

In matrix 100, cathode electrode 8 of each light receiving cell PD is common, that is, the cathode of each light receiving cell PD is connected to a common potential.

By grounding output terminals 4 to 7 and applying a positive potential to cathode electrode 8, a reverse bias is applied across a P-N junction of light receiving cell PD. Such arrangement prevents a decrease of an output current which can be extracted at output terminals 4 to 7 due to V-I (voltage-current) characteristics and an impedance component of the light receiving element. Also prevented is a delay of response of an output current to incidence of a light. An increase in cross-talk which will be described later can be also prevented.

Potential of output terminals 4 to 7 is not limited to a ground potential, and for example, IV may be applied to output terminals 4 to 7 and 5V to cathode electrode 8.

Figure 3:
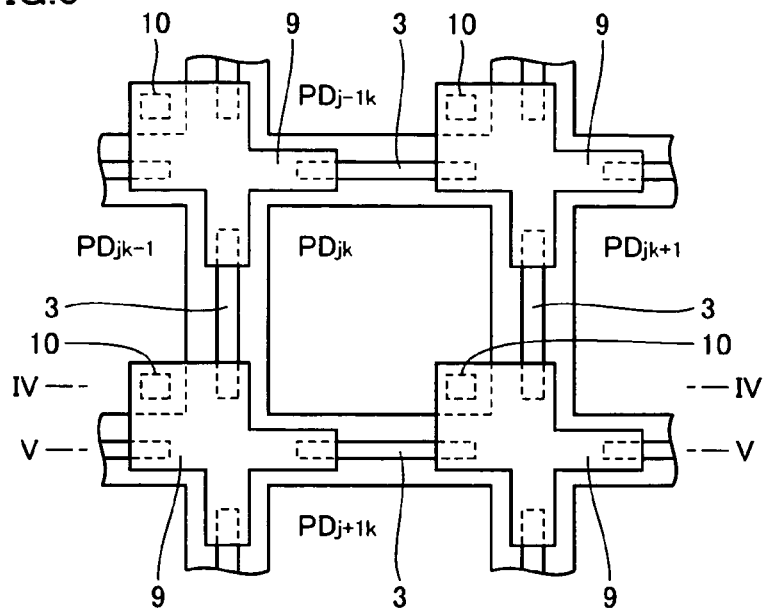
FIG. 3 is an expanded view showing the vicinity of a light receiving cell PDjk seen from the side of the light receiving surface of the light receiving element.
Figure 4:
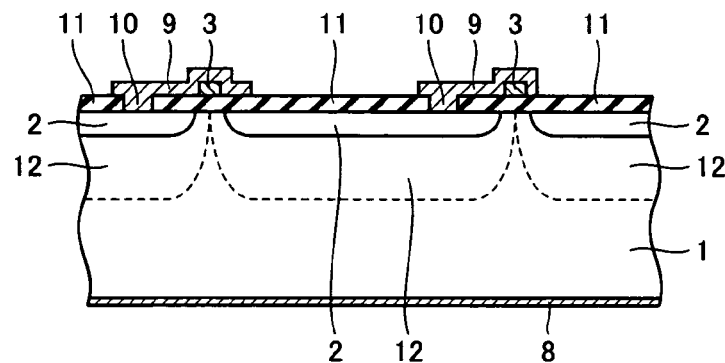
FIG. 4 is a sectional view showing the section taken along an IV-IV line in FIG. 3.
Figure 5:
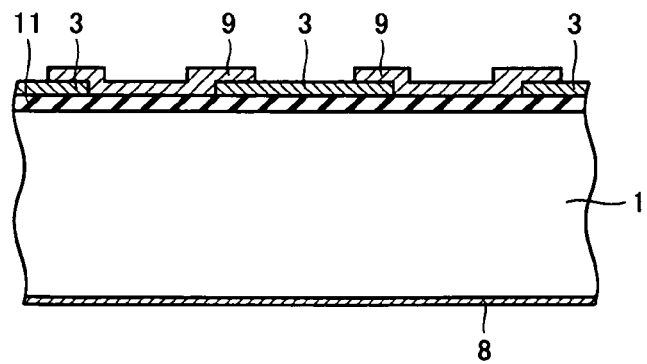
FIG. 5 is a sectional view showing the section taken along a V-V line in FIG. 3.

FIG. 3 is an expanded view showing the vicinity of a light receiving cell PDjk (j is a natural number satisfying j≦m, and k is a natural number satisfying k≦n) seen from the side of the light receiving surface of the light receiving element. FIG. 4 is a sectional view showing the section taken along an IV-IV line in FIG. 3. FIG. 5 is a sectional view showing the section taken along a V-V line in FIG. 3.

Each light receiving cell PD is formed by divisionally forming a P type diffusion layer 2 (semiconductor layer of a second conductivity type) on the side of a light receiving surface of an N type substrate 1 (semiconductor layer of a first conductivity type). Such a structure enables a light receiving element to be formed as one chip to realize scale-down of the light receiving element.

In light receiving cell PD, P type diffusion layer 2 serves as an anode layer and N type substrate 1 serves as a cathode layer. On the rear surface of N type substrate 1, cathode layer 8 is provided.

Used as N type substrate 1 is a resistance layer whose resistivity is high, that is, not less than 200 Ωcm and less than 8000 Ωcm. The reason of this use is to reduce cross-talk between light receiving cells PD by sufficiently expanding a depletion layer 12 by a reverse bias applied to light receiving cell PD to generate more optical carriers in depletion layer 12. For a semiconductor substrate to function as an N type substrate or a P type substrate, a resistivity of less than 8000 Ωcm is required in general. While with a resistivity of not less than 200 Ωcm, depletion layer 12 can be sufficiently expanded by a common reverse bias, a resistivity of not less than 500 Ωcm is more preferable.

Here, when optical carries are generated in N type substrate 1, because there exists no electric field in N type substrate 1, the generated optical carries will diffuse, that is, basically disperse. In a case, for example, where a light enters light receiving cell PDjk to generate optical carries directly under PDjk in FIG. 3, a part of the generated optical carriers will be taken into a light receiving cell PDj+1k on the periphery. Then, current flows also into light receiving cell PDj+1k which no light enters, that is, cross-talk occurs.

In addition, with a wavelength of a light being large, an approach length of the light is large to generate optical carries down to a position deep in N type substrate 1 from the surface (light receiving surface) of the substrate toward the rear surface. Furthermore, the higher the reverse bias voltage of a P-N junction becomes, the deeper into N type substrate 1 the depletion layer expands from the surface of the substrate toward the rear surface. In addition, the higher the resistivity of the resistance layer becomes, the more liable the depletion layer is to expand. Accordingly, in the light receiving element according to the embodiment of the present invention, use of a resistance layer having a high resistivity suppresses generation of optical carries outside depletion layer 12 to prevent an increase in cross-talk without increasing the reverse bias voltage of the P-N junction and without limiting a maximum wavelength of the light. In addition, because it is not necessary to increases the reverse bias voltage, simplification of the structure of the circuit to which the reverse bias voltage is applied and reduction of power consumption can be realized.

An oxide film (electrical insulting layer) 11 is formed on the light receiving surface of N type substrate 1 and in a region on oxide film 11 corresponding to an interval between light receiving cells PD, each resistor 3 is formed. Such a structure enables resistor 3 to be efficiently disposed in a free region on N type substrate 1, thereby realizing scale-down of the light receiving element.

In addition, each resistor 3 is formed of polysilicon. Thus, use of polysilicon having a high resistivity as resistor 3 enables an output current difference derived from a difference in a light incidence position to be increased to increase an S/N ratio of a position signal.

Further provided is a metal interconnection 9 which electrically connects light receiving cell PD, resistor 3 and output terminals 4 to 7. Metal interconnection 9 electrically connects resistors 3 in regions on oxide film 11 corresponding to the intervals between light receiving cells PD. Such a structure enables metal interconnection 9 to be efficiently disposed in a free region on N type substrate 1, thereby realizing scale-down of the light receiving element.

Next, description will be made of operation executed when a light enters the light receiving element according to the embodiment of the present invention.

Again with reference to FIG. 2, when a light enters a certain light receiving cell PD, excited optical carriers are separated by a P-N junction of light receiving cell PD, so that holes flow from the anode layer into output terminals 4 to 7 through resistor 3. More specifically, reception of light energy by atoms in depletion layer 12 leads to generation of pairs of electrons and holes, so that the holes enter P type diffusion layer 2 and the electrons enter N type substrate 1. At this time, the excited holes are distributed to output terminals 4 to 7 through a resistance network formed by each resistor 3.

Assume here that a current flowing into output terminal 4 is denoted as I4, a current flowing into output terminal 5 as I5, a current flowing into output terminal 6 as I6 and a current flowing into output terminal 7 as I7, a position signal (X, Y) indicative of a position of light receiving cell PD to which a light enters in the X axis direction and the Y axis direction on matrix 100 will be represented by the following expressions:

$$X=(I5-I4)/(I5+I4) \quad (1)$$

$$Y=(I6-I7)/(I6+I7) \quad (2)$$

Here, consideration will be given to whether a light receiving element structured without having resistance unit 3e can attain the object of the present invention or not. With such a structure, since when a light enters the peripheral part of matrix 100, that is, light receiving cells PD corresponding to the first row, the m-th row, the first column and the n-th column, currents output from light receiving cells PD all flow into the output terminals connected without passing through resistor 3, a position of the light receiving cell which the light enters can not be detected, resulting in failing to attain the object of the present invention.

Next, description will be made of a light receiving element manufacturing process according to the embodiment of the present invention.

Again with reference to FIG. 4 and FIG. 5, oxide film 11 is formed on the surface (light receiving surface) of N type substrate 1 by initial oxidization of N type substrate 1 and the formed oxide film 11 is selectively etched. Then, P type impurities such as boron are selectively injected into the surface of N type substrate 1 by ion implantation into the etched part and thereafter, P type diffusion layer 2 is formed by thermal processing.

Oxide film 11 on P type diffusion layer 2 is a thermal oxide film grown when P type diffusion layer 2 is formed by thermal processing. In addition, oxide film 11 on other part than P type diffusion layer 2 is a thermal oxide film grown at initial oxidization.

Next, polysilicon is grown on oxide film 11 of N type substrate 1 by LPCVD (Low Pressure Chemical Vapor Deposition). Then, N type impurities such as phosphorus are diffused into the polysilicon by ion implantation or thermal diffusion to adjust the polysilicon to have a predetermined resistance value. The polysilicon with the resistance value adjusted is selectively etched to form each resistor 3 on oxide film 11 of N type substrate 1.

Next, oxide film 11 is selectively etched to form an opening 10 and the opening is coated with an electrode material such as aluminum, which is patterned to form metal interconnection 9 and output terminals 4 to 7. Lastly, the rear surface of N type substrate 1 is coated with an electrode material to form cathode electrode 8.

In other region than opening 10 on the surface of N type substrate 1, oxide film 11 is formed.

Moreover, in the light receiving element according to the embodiment of the present invention, an area on the side of the light receiving surface of each light receiving cell PD is substantially the same. Such a structure facilitates manufacturing of a light receiving element to reduce manufacturing costs.

Possible is not only a structure in which an area on the side of the light receiving surface of each light receiving cell PD is substantially the same but also a structure in which at least one of the respective light receiving cells PD has a different light receiving surface area from those of other light receiving cells PD. With such a structure, even when, due to a structure of an optical system which uses a light receiving element for position detection, a part is generated in which a change of a position of an incident light on the light receiving element is extremely little with respect to a position change of an object to be measured, accurate position detection is enabled by adjusting the area of each light receiving cell PD to correct a position signal.

Further possible is a structure in which the areas of the light receiving surfaces of light receiving cells PD are gradually increased or decreased in the direction from the first row to the last row in the matrix of light receiving cells PD or in the direction from the first column to the last column. With such a structure, it is possible to cope with a case where a position signal requires linearity.

In addition, in the light receiving element according to the embodiment of the present invention, a resistance value of each resistor 3 is the same. Such a structure facilitates manufacturing of a light receiving element to reduce manufacturing costs.

Possible is not only a structure in which a resistance value of each resistor 3 is the same but also a structure in which resistor 3 connected to the anode of at least one light receiving cell PD among the respective light receiving cells PD has a resistance value different from those of other resistors 3. With such a structure, even when, due to a structure of an optical system which uses a position detection element, a part is generated in which a change of a position of an incident light on the light receiving element is extremely little with respect to a position change of an object to be measured, accurate position detection is enabled by adjusting the resistance value of resistor 3 to correct a position signal.

Further possible is a structure in which the resistance values of resistors 3 are gradually increased or decreased in the direction from the first row to the last row in the matrix of light receiving cells PD or in the direction from the first column to the last column. With such a structure, it is possible to cope with a case where a position signal requires linearity.

The position detection devices having a light receiving element recited in Patent Literature 1 and Patent Literature 2, however, have the drawback of difficulty in improving an S/N ratio of a position signal in terms of a manufacturing process. The light receiving element according to the embodiment of the present invention, on the other hand, includes a plurality of light receiving cells PD arranged in matrix. Then, the respective resistors of resistance units 3a to 3d electrically connect the anodes of the respective light receiving cells PD and output terminals 4 to 7 corresponding to the peripheral unit of matrix 100. Each resistor of resistance unit 3e electrically connects the anodes of light receiving cells PD adjacent to each other. When a light enters light receiving cell PD, excited optical carriers are distributed to output terminals 4 to 7 through a resistance network formed by each resistor 3. Then, based on a value of a current flowing into each output terminal, a position signal (X, Y) is obtained which is indicative of a position of light receiving cell PD having the incident light in the X axis direction and the Y axis direction in matrix 100. Such a structure enables an S/N ratio of a position signal to be increased by a simple manufacturing process of forming resistor 3 whose resistance value is high and uniform on N type substrate 1 in place of forming a resistance layer whose sheet resistivity is extremely high and forming a resistance layer whose sheet resistivity is extremely uniform in the whole region of the semiconductor substrate in order to increase an S/N ratio of a position signal as in the light receiving elements recited in Patent Literature 1 and Patent Literature 2. Accordingly, the light receiving element according to the embodiment of the present invention enables an S/N ratio of a position signal to be improved and a manufacturing process to be facilitated.

Although the light receiving element according to the embodiment of the present invention is structured such that P type diffusion layers 2 are divisionally formed on the side of the light receiving surface of N type substrate 1 to form each light receiving cell PD, the structure is not limited thereto. Each light receiving cell PD can be formed by divisionally forming the N type diffusion layers on the side of the light receiving surface of the P type substrate. In this case, the direction of the reverse bias voltage to be applied to light receiving cell PD is inverted. Then, when a light enters a certain light receiving cell PD, excited optical carries are separated by a P-N junction of light receiving cell PD, so that electrons enter the N type diffusion layer and holes enter the P type substrate. At this time, the excited electrons are distributed to output terminals 4 to 7 by the resistance network formed by each resistor 3.

In addition, although the light receiving element according to the embodiment of the present invention is structured to be one chip in which light receiving cell PD and the like are formed on N type substrate 1, the structure is not limited thereto. The object of the present invention can be attained also by a structure in which a diode or the like is used as light receiving cell PD and a discrete part or the like is used as resistor 3 to connect the respective light receiving cells PD and resistors 3 by a strap line.

Furthermore, the light receiving element according to the embodiment of the present invention is suitable for use, in particular, as sensors such as a measurement sensor, a wide-angle sensor and a paper size sensor. It is more suitable to use the sensors in such electronic apparatuses as a western-style toilet seat, an automatic cleaner, a copying machine and various kinds of robots.

Moreover, since the light receiving element according to the embodiment of the present invention is structured to include the number m×n of light receiving cells PD, output terminals 4 to 7, resistance units 3a to 3e and cathode electrode 8, a light receiving element whose structure is extremely simple can be provided. Structure of a sensor having the present light receiving element and that of an electronic apparatus having the sensor can be also simplified.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A light receiving element, comprising:
   a plurality of light receiving cells arranged in matrix each of which converts an incident light into an electric signal and has first and second electrodes whose polarities are different from each other,
   first to fourth output terminals,
   a first resistance unit including a plurality of resistors each having one end connected to said first electrode of said light receiving cell corresponding to the first column in the matrix of said light receiving cells and the other end connected to said first output terminal,
   a second resistance unit including a plurality of resistors each having one end connected to said first electrode of said light receiving cell corresponding to the last column in the matrix of said light receiving cells and the other end connected to said second output terminal,
   a third resistance unit including a plurality of resistors each having one end connected to said first electrode of said light receiving cell corresponding to the first row in the matrix of said light receiving cells and the other end connected to said third output terminal,
   a fourth resistance unit including a plurality of resistors each having one end connected to said first electrode of said light receiving cell corresponding to the last row in the matrix of said light receiving cells and the other end connected to said fourth output terminal, and
   a fifth resistance unit including a plurality of resistors which connect said first electrodes of said light receiving cells adjacent to each other in the matrix of said light receiving cells, wherein
   said second electrodes of said plurality of light receiving cells arranged in matrix are connected to a common potential.

2. The light receiving element according to claim 1, wherein said plurality of light receiving cells arranged in matrix have light receiving surfaces whose areas are substantially the same.

3. The light receiving element according to claim 1, wherein at least one of said plurality of light receiving cells arranged in matrix has a light receiving surface whose area is different from the light receiving surfaces of other said light receiving cells.

4. The light receiving element according to claim 1, wherein the areas of light receiving surfaces of said light receiving cells are gradually increased or decreased in the direction from the first row to the last row in the matrix of said light receiving cells or in the direction from the first column to the last column.

5. The light receiving element according to claim 1, wherein each said resistor has substantially the same resistance value.

6. The light receiving element according to claim 1, wherein said resistor connected to said first electrode of at least one said light receiving cell among said plurality of light receiving cells arranged in matrix has a resistance value different from resistance values of other said resistors.

7. The light receiving element according to claim 1, wherein resistance values of said resistors are gradually increased or decreased in the direction from the first row to the last row in the matrix of said light receiving cells or in the direction from the first column to the last column.

8. The light receiving element according to claim 1, wherein by divisionally forming a semiconductor layer of a second conductivity type on the side of a light receiving surface of a semiconductor layer of a first conductivity type, said plurality of light receiving cells arranged in matrix are formed.

9. The light receiving element according to claim 8, wherein a resistivity of said semiconductor layer of the first conductivity type is not less than 200 Ωcm and less than 8000 Ωcm.

10. The light receiving element according to claim 8, wherein an electrical insulting layer is formed on the light receiving surface of said semiconductor layer of the first conductivity type, and in a region on the electrical insulting layer corresponding to an interval between said light receiving cells adjacent to each other, each said resistor is formed.

11. The light receiving element according to claim 10, wherein each said resistor formed in the region between said light receiving cells adjacent to each other is made of polysilicon.

12. The light receiving element according to claim 8, wherein an electrical insulting layer is formed on the light receiving surface of said semiconductor layer of the first conductivity type, and in a region on said electrical insulting layer corresponding to an interval between said light receiving cells adjacent to each other, an interconnection is formed.

13. A sensor having a light receiving element, wherein said light receiving element includes:
   a plurality of light receiving cells arranged in matrix each of which converts an incident light into an electric signal and has first and second electrodes whose polarities are different from each other,
   first to fourth output terminals,
   a first resistance unit including a plurality of resistors each having one end connected to said first electrode of said light receiving cell corresponding to the first column in the matrix of said light receiving cells and the other end connected to said first output terminal,
   a second resistance unit including a plurality of resistors each having one end connected to said first electrode of said light receiving cell corresponding to the last column in the matrix of said light receiving cells and the other end connected to said second output terminal,
   a third resistance unit including a plurality of resistors each having one end connected to said first electrode of said light receiving cell corresponding to the first row in the matrix of said light receiving cells and the other end connected to said third output terminal, a fourth resistance unit including a plurality of resistors each having one end connected to said first electrode of said light receiving cell corresponding to the last row in the matrix of said light receiving cells and the other end connected to said fourth output terminal, and a fifth resistance unit including a plurality of resistors which connect said first electrodes of said light receiving cells adjacent to each other in the matrix of said light receiving cells, and wherein said second electrodes of said plurality of light receiving cells arranged in matrix are connected to a common potential.

14. An electronic apparatus including a sensor having a light receiving element, wherein said light receiving element includes a plurality of light receiving cells arranged in matrix each of which converts an incident light into an electric signal and has first and second electrodes whose polarities are different from each other, first to fourth output terminals, a first resistance unit including a plurality of resistors each having one end connected to said first electrode of said light receiving cell corresponding to the first column in the matrix of said light receiving cells and the other end connected to said first output terminal, a second resistance unit including a plurality of resistors each having one end connected to said first electrode of said light receiving cell corresponding to the last column in the matrix of said light receiving cells and the other end connected to said second output terminal, a third resistance unit including a plurality of resistors each having one end connected to said first electrode of said light receiving cell corresponding to the first row in the matrix of said light receiving cells and the other end connected to said third output terminal, a fourth resistance unit including a plurality of resistors each having one end connected to said first electrode of said light receiving cell corresponding to the last row in the matrix of said light receiving cells and the other end connected to said fourth output terminal, and a fifth resistance unit including a plurality of resistors which connect said first electrodes of said light receiving cells adjacent to each other in the matrix of said light receiving cells, and wherein said second electrodes of said plurality of light receiving cells arranged in matrix are connected to a common potential.

* * * * *